United States Patent
Chuang et al.

(10) Patent No.: US 10,164,169 B2
(45) Date of Patent: Dec. 25, 2018

(54) MEMORY DEVICE HAVING A SINGLE BOTTOM ELECTRODE LAYER

(71) Applicant: Taiwan Semiconductor Manufacturing Co., Ltd., Hsin-Chu (TW)

(72) Inventors: Harry-Hak-Lay Chuang, Zhubei (TW); Hung Cho Wang, Taipei (TW); Tong-Chern Ong, Chong-Her (TW); Wen-Ting Chu, Kaohsiung (TW); Yu-Wen Liao, New Taipei (TW); Kuei-Hung Shen, Hsinchu (TW); Kuo-Yuan Tu, Hsinchu (TW); Sheng-Huang Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/393,892

(22) Filed: Dec. 29, 2016

(65) Prior Publication Data
US 2018/0097173 A1 Apr. 5, 2018

Related U.S. Application Data

(60) Provisional application No. 62/402,132, filed on Sep. 30, 2016.

(51) Int. Cl.
| | |
|---|---|
| H01L 47/00 | (2006.01) |
| H01L 43/02 | (2006.01) |
| H01L 45/00 | (2006.01) |
| H01L 43/08 | (2006.01) |
| H01L 43/10 | (2006.01) |
| H01L 43/12 | (2006.01) |

(52) U.S. Cl.
CPC .............. *H01L 43/02* (2013.01); *H01L 43/08* (2013.01); *H01L 43/10* (2013.01); *H01L 43/12* (2013.01); *H01L 45/1233* (2013.01); *H01L 45/1608* (2013.01)

(58) Field of Classification Search
CPC .............................. H01L 27/228; H01L 43/12
See application file for complete search history.

(56) References Cited

U.S. PATENT DOCUMENTS

| | | | |
|---|---|---|---|
| 8,962,349 B1 * | 2/2015 | Chen | H01L 43/12 257/421 |
| 2010/0264501 A1 * | 10/2010 | Furuta | B82Y 10/00 257/421 |

* cited by examiner

*Primary Examiner* — Meiya Li
(74) *Attorney, Agent, or Firm* — Eschweiler & Potashnik, LLC (57) ABSTRACT

The present disclosure relates to a method of manufacturing a memory device. The method is performed by forming an inter-layer dielectric (ILD) layer over a substrate, and forming an opening within a dielectric protection layer over the ILD layer. A bottom electrode layer is formed within the opening and over the dielectric protection layer. A chemical mechanical planarization (CMP) process is performed on the bottom electrode layer to form a bottom electrode structure having a planar upper surface and a projection that protrudes outward from a lower surface of the bottom electrode structure to within the opening. A memory element is formed over the bottom electrode structure, and a top electrode is formed over the memory element.

20 Claims, 8 Drawing Sheets

MEMORY DEVICE HAVING A SINGLE BOTTOM ELECTRODE LAYER

REFERENCE TO RELATED APPLICATION

This Application claims priority to U.S. Provisional Application No. 62/402,132 filed on Sep. 30, 2016, the contents of which is hereby incorporated by reference in its entirety.

BACKGROUND

Many modern electronic devices contain electronic memory configured to store data. Electronic memory may be volatile memory or non-volatile memory. Non-volatile memory is able to store data in the absence of power, whereas volatile memory is not. Magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in semiconductor manufacturing is to integrate different types of devices on a single substrate to achieve higher integration. For example, a logic region and a memory region may be formed on a single substrate. In some embodiments, the memory region may comprise a magnetic random access memory (MRAM) device or a resistive random access memory (RRAM) device. MRAM and RRAM devices comprise memory cells having resistive elements that are vertically arranged within a back-end-of-the-line (BEOL) metal stack between a bottom electrode and a top electrode.

To form an MRAM or RRAM memory cell, a bottom electrode via layer is overfilled into an opening in an underlying dielectric layer. The opening typically has a high aspect ratio which can lead to defects during filling. For example, gap-fill seams and grain growth limitation defects may be present in the bottom electrode via layer. After filling, a first chemical mechanical planarization (CMP) process can be used to planarize the bottom electrode via layer to form a bottom electrode via (BEVA) within the opening. A bottom electrode layer is subsequently formed over the BEVA. A second CMP process is then performed on the bottom electrode layer to form a bottom electrode upon which a memory element is subsequently formed.

The defects during filling can prevent the first and second CMP processes from giving the bottom electrode a planar upper surface, thereby resulting in an abnormal memory element interface that reduces yield and degrades IC performance. While certain conductive materials, such as copper, may not succumb to defects during filling, these materials are undesirable since they suffer from iso-dense electroplating issues and CMP corrosion issues. Furthermore, a periphery logic region may be damaged by the CMP processes within a memory region. For example, the bottom electrode layer of the memory region has a higher structural integrity than metal interconnect lines within the periphery logic region. When the bottom electrode layer of the memory region is exposed to a CMP process, the metal interconnect of the logic region is also exposed. Because the metal interconnect line is structurally weaker than the bottom electrode, performing a CMP process on the bottom electrode layer can cause "dishing" of the metal interconnect lines in the logic region, further degrading the reliability of the resultant IC.

The present disclosure relates to a memory device having bottom electrode region and bottom electrode via region that comprise a single layer (e.g., a continuous, seamless layer of conductive material), and associated fabrication methods. To form the memory device, an opening is formed in a dielectric protection layer. The opening is overfilled with a bottom electrode layer. The BEVA is formed in the opening from the bottom electrode layer and the overfill of the bottom electrode layer is planarized to form a planarized bottom electrode layer having a bottom electrode region and a bottom electrode via (BEVA) region. Accordingly, the transition between the BEVA region and the bottom electrode region is seamless. A memory element (e.g., a MTJ or RRAM cell) is formed over the planarized bottom electrode layer. By forming the BEVA region and the bottom electrode region as one layer, planarization problems are mitigated and the fabrication methods are simplified and more efficient. As a result, risk of damaging the lower metal lines is reduced, thereby providing more reliable read/write operations and/or better performance.

Figure 1:
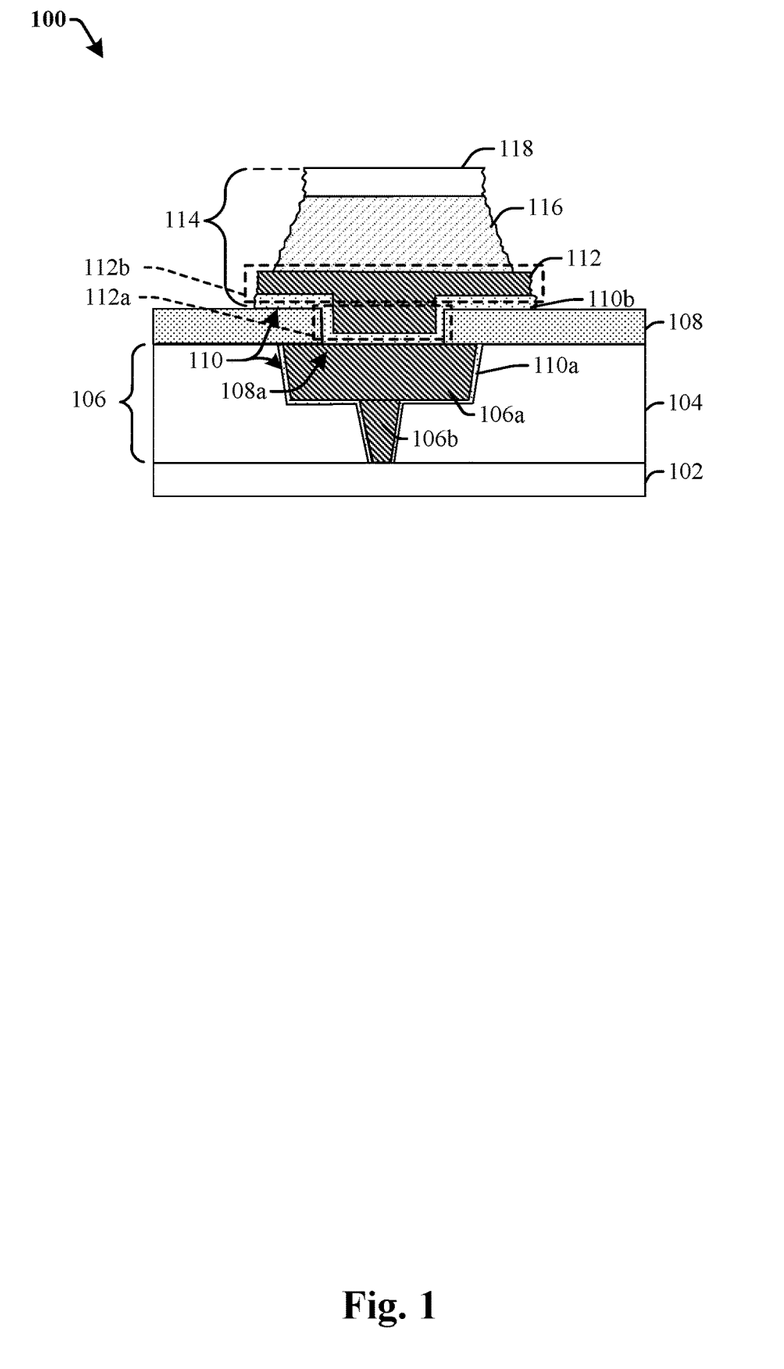
FIG. 1 illustrates a cross-sectional view of some embodiments of a memory device having a single bottom electrode structure comprising a bottom electrode region and a bottom electrode via region.

FIG. 1 illustrates a cross-sectional view of some embodiments of a memory device having a single bottom electrode structure comprising a bottom electrode region and a bottom electrode via region.

The memory device 114 is arranged over a substrate 102. In some embodiments, the substrate 102 may comprise a semiconductor material, such as for example, a silicon substrate. An inter-layer dielectric (ILD) layer 104 is arranged over the substrate 102. The ILD layer 104 surrounds a plurality of metal layers 106 including a metal line 106a and a metal via 106b. The plurality of metal layers 106 may be comprised of a conductive material such as copper.

A dielectric protection layer 108 is arranged over the ILD layer 104. The dielectric protection layer 108 includes an opening 108a that extends through the dielectric protection layer 108 to an underlying one of the plurality of metal layers 106. In various embodiments, the opening 108a is arranged over the metal line 106a or a metal via 106b (not shown). A passivation layer 110 acts as a diffusion barrier and includes passivation layers 110a and 110b. In some embodiments, the passivation layer 110 may comprise tantalum nitride (TaN), titanium nitride (TiN), a dielectric material such as TEOS (Tetraethyl Orthosilicate), or combinations thereof.

Passivation layer 110a is conformally disposed around at least a portion of metal layers 106. For example, the passivation layer 110a may be in direct contact with the metal line 106a. Passivation layer 110b is disposed conformally over the dielectric protection layer 108 and lines the opening 108a. In various embodiments, the dielectric protection layer 108 may extend outward from the opening 108a or may be confined within the opening 108a. The dielectric protection layer 108 may comprise silicon carbide, silicon nitride, or combinations thereof.

A bottom electrode structure 112 is arranged over the passivation layer 110b. The bottom electrode structure 112 overfills the opening 108a and overlies the passivation layer 110b. The bottom electrode structure 112 comprises both a bottom electrode via (BEVA) region 112a and a bottom electrode region 112b. The BEVA region 112a comprises a projection extending outward from a lower surface of the bottom electrode region 112b to a position that is surrounded by the dielectric protection layer 108. The bottom electrode region 112b extends past opposing sides of the BEVA region 112a and comprises a planar upper surface. A height of the BEVA region 112a extends from a bottom surface of the bottom electrode structure 112 to a top surface of the passivation layer 110b and a height of the bottom electrode region 112b extends between the top surface of the passivation layer 110b and the top surface of the bottom electrode structure 112.

The memory device 114 further comprises a memory element 116 arranged over the bottom electrode region 112b and a top electrode 118 arranged over the memory element 116. In some embodiments, the bottom electrode structure 112 comprises a single layer of material that continuously extends from a surface of the passivation layer 110b within the opening 108a to a bottom surface of the memory element 116. For example, in some embodiments, the bottom electrode structure 112 may comprise a metal nitride layer, such as titanium nitride (TiN), which continuously extends from the passivation layer 110b within the opening 108a to contact a bottom surface of the memory element 116. In other embodiments, the bottom electrode structure 112 may comprise a tungsten (W) layer that continuously extends from the passivation layer 110b within the opening 108a to contact a bottom surface of the memory element 116.

In some embodiments, the sidewalls of the bottom electrode region 112b are substantially vertical. In other embodiments, the bottom electrode region 112b may have planar top and bottom surfaces and tilted sidewalls. In some embodiments, the memory element 116 may comprise a magnetic tunnel junction (MTJ) of a magnetoresistive random-access memory (MRAM) cell. In other embodiments, the memory element 116 may comprise a dielectric data storage layer of a resistive random access memory (RRAM) cell.

Because the BEVA region 112a and the bottom electrode region 112b are comprised within a single bottom electrode structure 112, there is no seam interface and/or grain boundaries located between the BEVA region 112a and the bottom electrode region 112b, thereby eliminating filling defects that may otherwise degrade performance and reduce scalability of the memory device. Furthermore, using one bottom electrode structure 112 simplifies the manufacturing process because the BEVA region 112a and the bottom electrode region 112b do not require separate deposition and planarization processes. Therefore, in addition to improving operation of the memory device 114, the fabrication methods are simplified and more efficient.

Figure 2A:
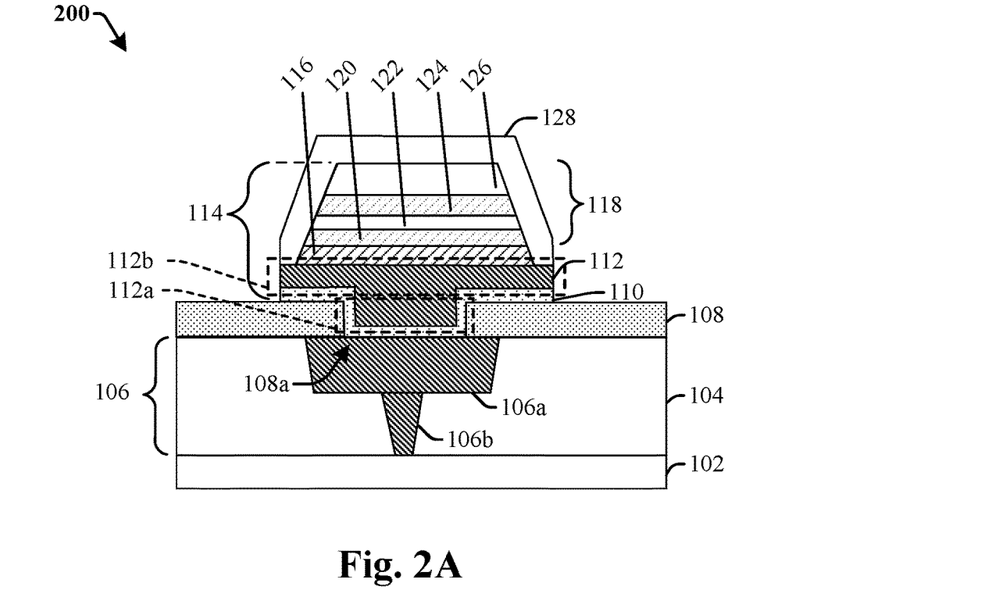
FIG. 2A illustrates a cross-sectional view of some alternative embodiments of a memory device having a single bottom electrode structure comprising a bottom electrode region and a bottom electrode via region.

FIG. 2A illustrates a cross-sectional view 200 of other embodiments of a memory device 114 having a bottom electrode structure 112 comprising a single layer having a BEVA region 112a and a bottom electrode region 112b. The substrate 102, the ILD layer 104, the metal layers 106 including the metal line 106a and the metal via 106b, the dielectric protection layer 108, the passivation layer 110, and the bottom electrode structure 112 operate in a similar manner as described above.

In some embodiments, the top electrode 118 comprises one or more conductive layers overlying the memory element 116. In some embodiments, the top electrode 118 may comprise a first top electrode layer 120 and a second top electrode layer 122 comprising a different material than the first top electrode layer 120. In some additional embodiments, the top electrode 118 may further comprise a hard mask layer 124 over the second top electrode layer 122, and a third top electrode layer 126 over the hard mask layer 124. In some embodiments, the first top electrode layer 120, the second top electrode layer 122, and the third top electrode layer 126 may be comprised of conductive materials such as titanium nitride (TiN), tantalum nitride (TaN), tantalum (Ta), and/or titanium (Ti), or combinations thereof. The hard mask layer 124 may be comprised of silicon nitride (SiN). In some embodiments, an upper portion of the memory device 114 is surrounded by a dielectric spacer layer 128.

Figure 2B:
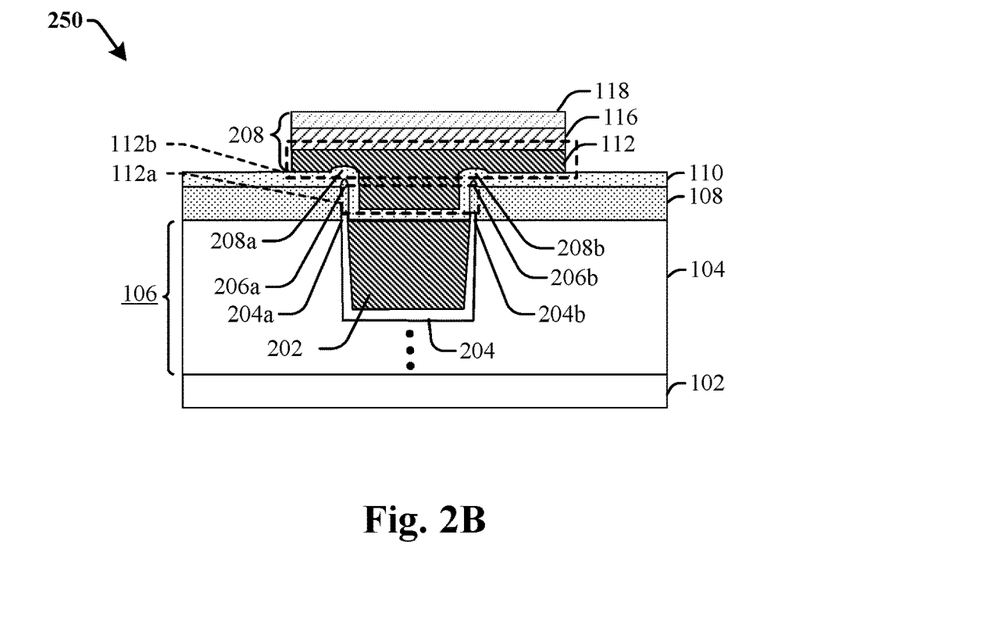
FIG. 2B illustrates a cross-sectional view of some other embodiments of a memory device having a single bottom electrode structure.

FIG. 2B illustrates a cross-sectional view 250 of some alternative embodiments of a memory device 208.

The memory device 208 comprises a bottom electrode structure 112 having a BEVA region 112a and bottom electrode region 112b. The bottom electrode structure 112 is arranged within and over a dielectric protection layer 108, which overlies a metal via 202 arranged within an ILD layer 104. In some embodiments, the metal via 202 may be comprised of a conductive material, such as copper. In some embodiments, the dielectric protection layer 108 may comprise a single layer of silicon carbide. In other embodiments, the dielectric protection layer 108 may comprise a stack of different dielectric materials. For example, in some embodiments, the dielectric protection layer 108 may comprise a stack comprising a layer of silicon carbide and a layer of silicon-rich oxide disposed on the layer of silicon carbide.

To keep the conductive material from diffusing in the ILD layer 104, the metal via 202 may be separated from the ILD layer 104 by a diffusion barrier layer 204. The diffusion barrier layer 204 may have diffusion barrier protrusions 204a/204b that protrude outward into the overlying dielectric protection layer 108. The diffusion barrier protrusions 204a/204b result in dielectric protection layer protrusions 206a/206b and passivation protrusions 208a/208b laterally arranged over the diffusion barrier protrusions 204a/204b, respectively. The passivation protrusions 208a/208b cause the bottom electrode region 112b to have depressions within a lower surface facing the substrate 102, while an upper surface of the bottom electrode region 112b facing an opposite direction than the lower surface is substantially planar.

Although FIGS. 1, 2A, and 2B illustrates an "on-axis" BEVA, it will be appreciated that the disclosed memory devices may also comprise an "off-axis" BEVA, such that the BEVA region 112a is aligned according to a bottom electrode axis while the memory element 116 and the top electrode 118 are aligned according to a top electrode axis that has a horizontal shift with respect to the bottom electrode axis.

Figure 3A:
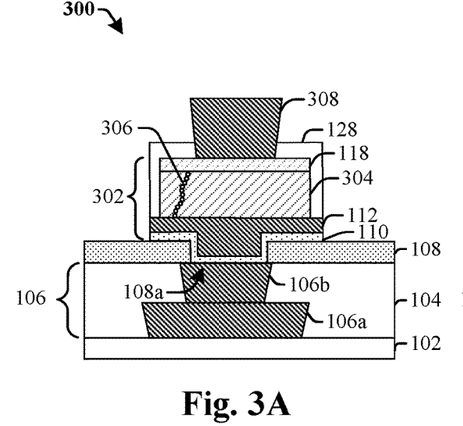
FIGS. 3A-3B illustrate cross-sectional view of some additional embodiments of memory devices having a single bottom electrode structure.
Figure 3B:
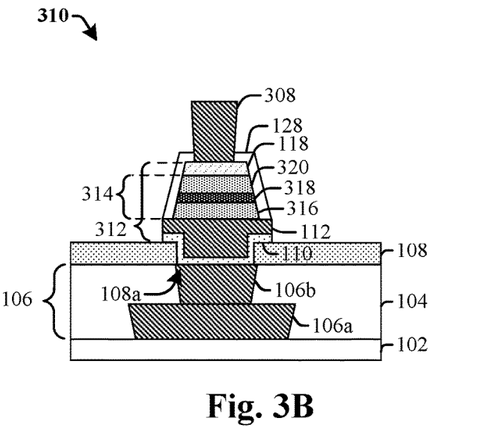

FIGS. 3A-3B illustrate cross-sectional views, 300 and 304, of various embodiments of a memory device 114 having a resistive switching element.

As shown in cross-sectional view 300 of FIG. 3A, a memory device 302 is arranged over a substrate 102. The memory device 302 comprises a bottom electrode structure 112 extending from within a dielectric protection layer 108 to an overlying resistive switching layer 304. The resistive switching layer 304 comprises a dielectric data storage layer arranged between the bottom electrode structure 112 and a top electrode 118. The top electrode 118 is further coupled to an overlying upper metal via 308, which extends through the dielectric spacer layer 128.

The dielectric data storage layer has a variable resistance value that depends upon conductive filaments 306, comprising a chain of oxygen vacancies, which may extend through the dielectric data storage layer. In some embodiments, the dielectric data storage layer may comprise a high-k dielectric layer. For example, in various embodiments, the dielectric data storage layer nickel oxide (NiO), titanium oxide (TiO), hafnium oxide (HfO), zirconium oxide (ZrO), zinc oxide (ZnO), tungsten oxide ($WO_3$), aluminum oxide ($Al_2O_3$), tantalum oxide (TaO), molybdenum oxide (MoO), and/or copper oxide (CuO), for example.

As shown in cross-sectional view 310 of FIG. 3B, a memory device 312 is arranged over a substrate 102. The memory device 312 comprises a bottom electrode structure 112 extending from within a dielectric protection layer 108 to an overlying resistive switching layer 314 comprising a magnetic tunnel junction (MTJ) vertically arranged between the bottom electrode structure 112 and a top electrode 118. The MTJ comprises a pinned magnetic layer 316 and a free magnetic layer 320, which are vertically separated by a dielectric barrier layer 318. In some embodiments, an anti-ferromagnetic layer (not shown) may be arranged between the bottom electrode structure 112 and the pinned magnetic layer 316. The magnetic orientation of the pinned magnetic layer 316 is static (i.e., fixed), while the magnetic orientation of the free magnetic layer 320 is capable of switching between a parallel configuration with respect to that of the pinned magnetic layer 316 and an anti-parallel configuration. The parallel configuration provides for a low resistance state that digitally stores data as a first bit value (e.g., a logical "0"). The anti-parallel configuration provides for a high resistance state that digitally stores data as a second bit value (e.g., a logical "1").

In some embodiments, the anti-ferromagnetic layer may comprise iridium manganese (IrMn), iron manganese (FeMn), ruthenium manganese (RuMn), nickel manganese (NiMn), and/or palladium platinum manganese (PdPtMn). In some embodiments, the pinned magnetic layer 316 may comprise a first ferromagnetic layer including cobalt (Co), iron (Fe), boron (B), and/or ruthenium (Ru). In some embodiments, the dielectric barrier layer 318 may comprise a tunnel barrier layer including magnesium oxide (MgO) and/or aluminum oxide ($Al_2O_3$). In some embodiments, the free magnetic layer 320 may comprise a second ferromagnetic layer including cobalt (Co), iron (Fe), and/or boron (B).

Figure 4:
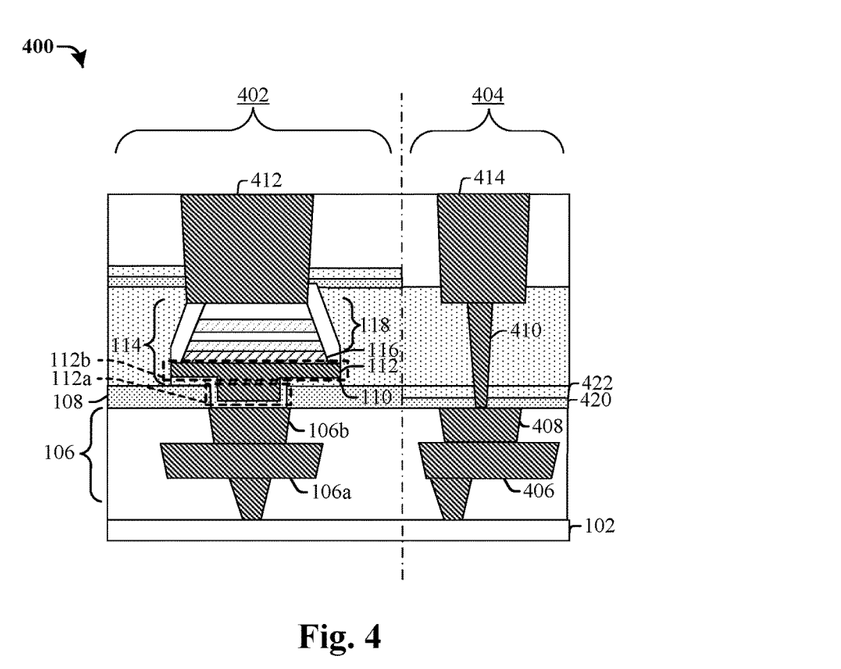
FIG. 4 illustrates a cross-sectional view of some embodiments of an integrated circuit (IC) having a memory region and a periphery logic region.

FIG. 4 illustrates a cross-sectional view 400 of some embodiments of an integrated circuit (IC) having a memory region 402 and a periphery logic region 404. The memory region 402 and the periphery logic region 404 are arranged over the substrate 102. The memory region 402 comprises a memory device 114 having a bottom electrode structure 112 arranged over a passivation layer 110 within a dielectric protection layer 108 that is disposed over a metal via 106b. The periphery logic region 404 comprises a bottom via layer 408 that extends from a lower metal layer 406 to an intermediate metal wire layer 410 laterally offset from the memory device 114. In some embodiments, the bottom via layer 408 extends from the lower metal layer 406 to a position that is aligned with a top surface of metal via 106b. A first upper metal via 412 is coupled to the memory device 114, and a second upper metal via 414 is coupled to the intermediate metal wire layer 410. In some embodiments, an upper etch stop liner 420 and/or a protective liner 422 are disposed surrounding a portion of the upper metal vias 412, 414.

In some embodiments, the bottom via layer 408 has a height that is larger than a height of the metal via 106b. In some embodiments, the larger height of the bottom via layer 408 causes the bottom via layer 408 to have an upper surface that is co-planar with a top surface of the passivation layer 110. Because the bottom electrode structure 112 is a single conductive layer, a single CMP process may be used to form the upper surface of the bottom electrode structure 112. The use of a single CMP process prevents damage to the periphery logic region 404 (e.g., dishing of the bottom via layer 408), which would occur using a separate CMP process to form the BEVA region 112a. In other words, by forming the BEVA region 112a and the bottom electrode region 112b from a single layer, additional BEVA planarization and/or patterning processes are not needed. Because the planarization and/or patterning processes of the memory region 402 can degrade the periphery logic region 404, reducing the amount of the planarization and/or patterning processes reduces the risk to the periphery logic region 404, thereby providing more reliable read/write operations and/or better performance.

FIGS. 5-14 illustrate some embodiments of cross-sectional views showing a method of forming a memory device having a single layer BEVA and bottom electrode.

Figure 5:
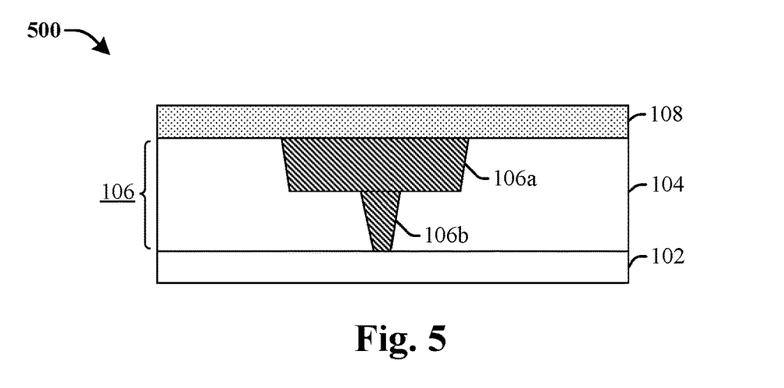
FIGS. 5-14 illustrate cross-sectional views of some embodiments showing a method of manufacturing a memory device having a single bottom electrode structure comprising a bottom electrode region and bottom electrode via region.

As shown in cross-sectional view 500 of FIG. 5, a lower ILD layer 104 is formed over a substrate 102. The lower ILD layer 104 includes a plurality of metal layers 106 such as metal line 106a and metal via 106b. In some embodiments, the plurality of metal layers 106 are formed by forming a lower ILD layer 104 (e.g., an oxide, a low-k dielectric, or an ultra low-k dielectric) over the substrate 102, followed by a damascene process to form openings within the lower ILD layer 104 and fill a metal material (e.g., copper, aluminum, etc.) into the openings. A planarization process can be then performed to remove excess metal material to form the plurality of metal layers 106.

A dielectric protection layer 108 is formed over the lower ILD layer 104. In some embodiments, the dielectric protection layer 108 may be comprised of silicon-nitride (SiN), silicon-carbide (SiC), or a similar composite dielectric film. In some embodiments, the dielectric protection layer 108 may be approximately 30 nanometers thick. The dielectric protection layer 108 may be formed by one or more deposition processes (e.g., physical vapor deposition, chemical vapor deposition, etc.).

Figure 6:
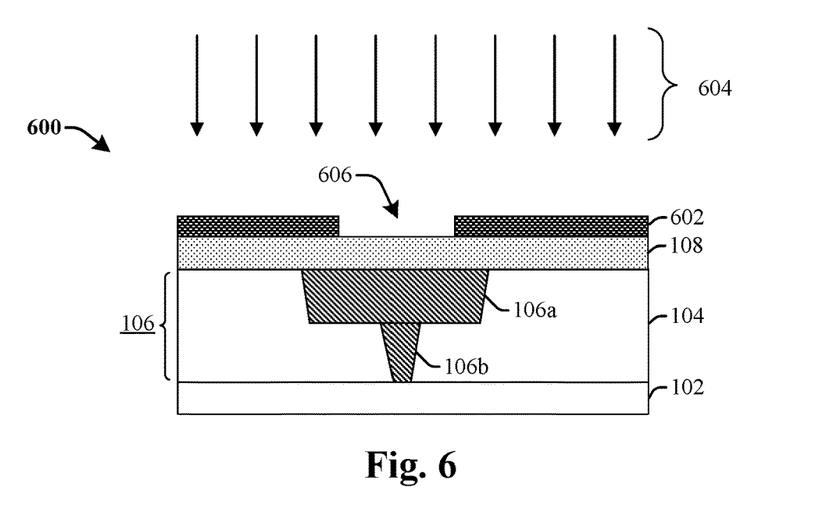

As shown in cross-sectional view 600 of FIG. 6, a mask layer 602 is formed and patterned over the dielectric protection layer 108. An etching process 604 is performed through an etch opening 606 in the mask layer 602 to pattern the dielectric protection layer 108. In some embodiments, the mask layer 602 can be a photoresist layer. In some embodiments, the etch opening 606 allows a dry etch process, such as a plasma etching, to reach the dielectric protection layer 108.

Figure 7:
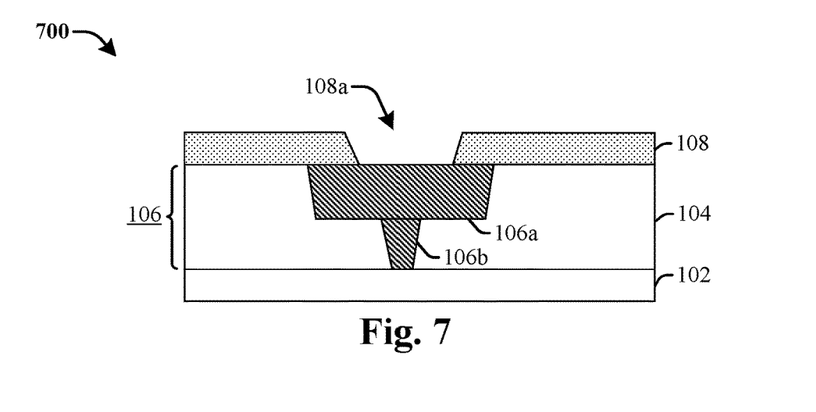

As shown in cross-sectional view 700 of FIG. 7, the mask layer 602, shown in FIG. 6 is removed leaving an opening 108a in the dielectric protection layer 108 that corresponds to the etch opening 606 shown in FIG. 6. The opening 108a may comprise a low aspect ratio opening. For example, in some embodiments, the opening 108a may have a greater width (direction parallel to top surface of substrate 102) than height (direction perpendicular to top surface of substrate 102). The low aspect ratio of the opening 108a reduces gap fill issues during subsequent processing steps.

Figure 8:
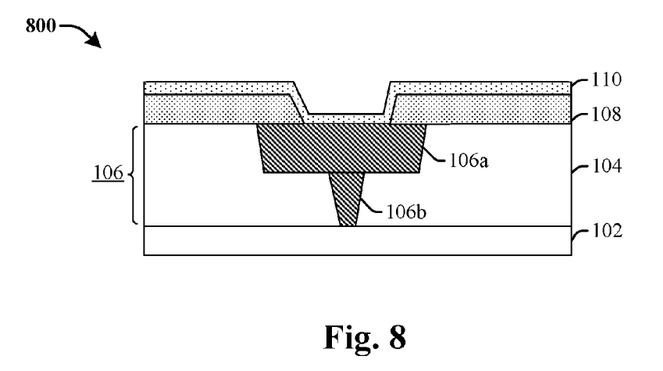

As shown in cross-sectional view 800 of FIG. 8, a passivation layer 110 is conformally deposited over the dielectric protection layer 108 and within the opening 108a. In some embodiments, the passivation layer 110 may be comprised of tantalum (Ta) or tantalum nitride (TaN). In other embodiments, the passivation layer 110 may be comprised of silicon nitride, tetraethyl orthosilicate (TEOS), silicon-rich oxide (SRO), or a similar dielectric film.

Figure 9A:
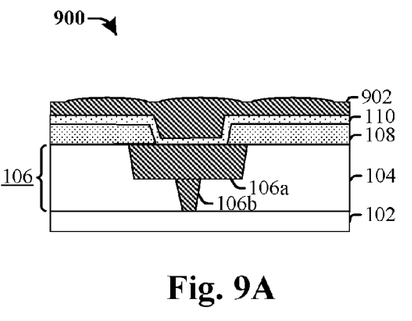

As shown in cross-sectional view 900 of FIG. 9A, a bottom electrode layer 902 is deposited over the passivation layer 110 and into the opening 108a, discussed above with respect to FIG. 7. In some embodiments, the bottom electrode layer 902 may be deposited by way of a single, continuously deposition process. In other embodiments, the bottom electrode layer 902 may be deposited by way of a plurality of deposition processes performed in-situ (i.e., without breaking a vacuum of a deposition chamber in which the deposition processes are performed).

In some embodiments, the bottom electrode layer 902 is comprised of a conductive material, such as, titanium nitride (TiN) or tantalum nitride (TaN), a metal (e.g., titanium (Ti) or tantalum (Ta) copper), etc. The bottom electrode layer 902 may be formed to a thickness of approximately 50 nanometers. Though not shown, in some embodiments, a diffusion barrier layer may be deposited over the passivation layer 110 prior to depositing the bottom electrode layer 902.

Figure 9B:
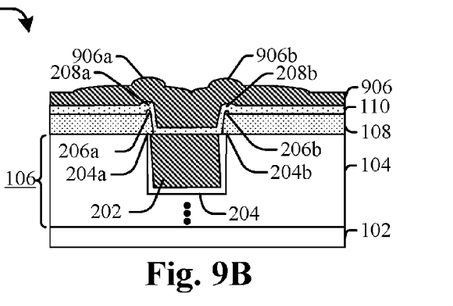

In some embodiments, shown in cross-section view 904 of FIG. 9B, a diffusion barrier layer 204 may be deposited surrounding a lower metal via 202. In such embodiments, the diffusion barrier layer 204 may comprise diffusion barrier protrusions 204a/204b that propagate through one or more overlying layers during fabrication. For example, the dielectric protection layer 108 may have protrusions 206a/206b laterally arranged over the diffusion barrier protrusions 204a/204b, respectively. Likewise, the passivation layer 110 may have passivation protrusions 208a/208b that are laterally arranged over the diffusion barrier protrusions 204a/204b and dielectric protection protrusions 206a/206b. Thus, when the bottom electrode layer 906 is deposited over the passivation layer 110, the bottom electrode layer 906 has bottom electrode protrusions 906a/906b.

Figure 10A:
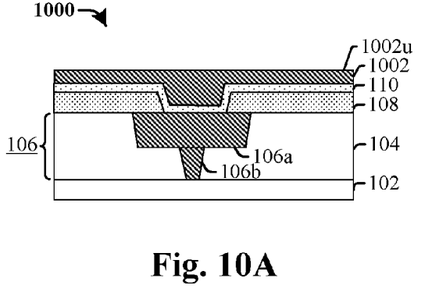

As shown in cross-sectional view 1000 of FIG. 10A, the bottom electrode layer 902 is planarized to remove excess conductive material, resulting in a planarized bottom electrode layer 1002 having a planar upper surface 1002u overlying the passivation layer 110. In some embodiments, the planarization may be performed using a chemical mechanical planarization (CMP) process. The CMP process may be a form of "light" CMP process performed to reduce the thickness of the bottom electrode layer 902 from approximately 50 nanometers to 30 nanometers. In some embodiments, the light CMP process may be performed by bringing the substrate into contact with a polishing pad at a pressure that is less than that of the CMP process performed on the ILD layer 104.

Figure 10B:
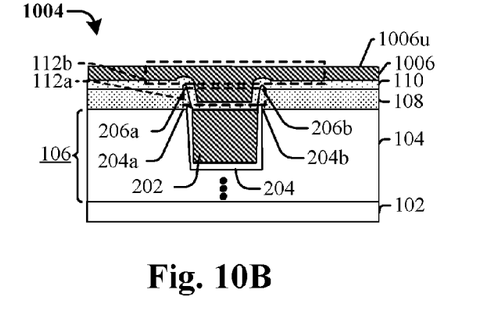

As shown in cross-sectional view 1004 of FIG. 10B, the bottom electrode protrusions 906a/906b are removed by the CMP process resulting in a planarized bottom electrode layer 1006 having a planar upper surface 1006u and a lower surface with depressions.

Figure 11:
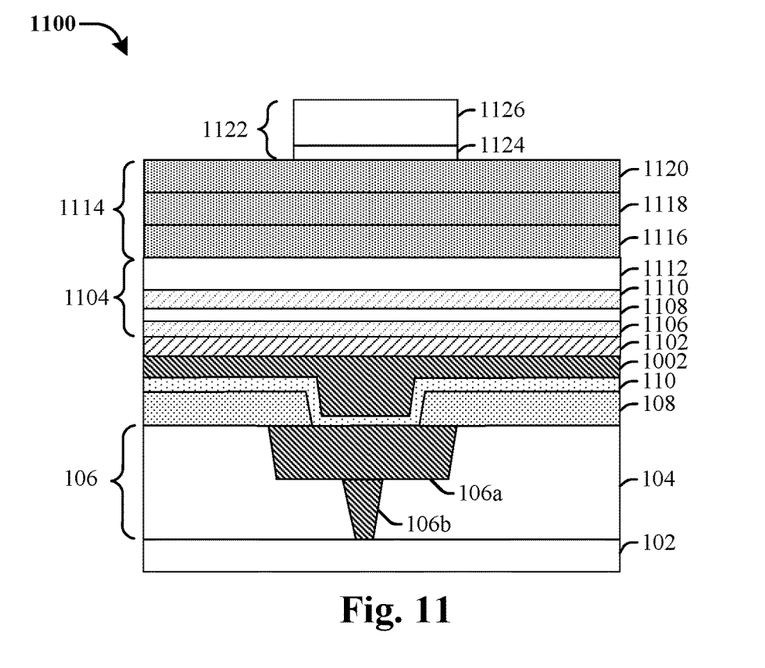

As shown in cross-sectional view 1100 of FIG. 11, a resistive switching layer 1102 is formed over the planarized bottom electrode layer 1002. In some embodiments, the resistive switching layer 1102 may comprise a magnetic tunnel junction (MTJ) structure having a pinned magnetic layer and a free magnetic layer, which are vertically separated by a dielectric barrier layer. In other embodiments, the resistive switching layer 1102 may comprise a RRAM dielectric data storage layer. In some embodiments, the resistive switching layer 1102 is approximately 3 nanometers thick.

One or more top electrode layers 1104 are formed over the resistive switching layer 1102. The one or more top electrode layers 1104 comprise one or more conductive layers. In some embodiments, the one or more top electrode layers 1104 include a first conductive layer 1106, a second conductive layer 1108, a first hard mask layer 1110, and a third conductive layer 1112. The first conductive layer 1106, the second conductive layer 1108, and the third conductive layer 1112 may be comprised of titanium nitride (TiN) or tantalum nitride (TaN), a metal (e.g., titanium (Ti) or tantalum (Ta) copper) etc. The first hard mask layer 1110 may be comprised of silicon nitride (SiN). In some embodiments, first conductive layer 1106 is approximately 15 nanometers thick, the second conductive layer 1108 is approximately 30 nanometers thick, the first hard mask layer 1110 is approximately 15 nanometers thick, and the third conductive layer 1112 is approximately 35 nanometers thick.

In some embodiments, a plurality of hard mask layers 1114 are disposed over the one or more top electrode layers 1104. The plurality of hard mask layers 1114 includes a second hard mask layer 1116, a third hard mask layer 1118, and a fourth hard mask layer 1120. The plurality of hard mask layers 1114 may be comprised of one or more of an advanced pattern film (APF), silicon oxynitride (SiON), etc. The second hard mask layer 1116 is approximately 130 nanometers thick, the third hard mask layer 1118 is approximately 200 nanometers thick, and the fourth hard mask layer 1120 is approximately 38 nanometers thick.

At least one patterning layer 1122 is formed over the plurality of hard mask layers 1114. The at least one patterning layer 1122 may include a bottom antireflective coating (BARC) layer 1124 and a photoresist layer 1126 which has been spin-coated over the BARC layer 1124 and patterned using a double-patterning technique.

Figure 12:
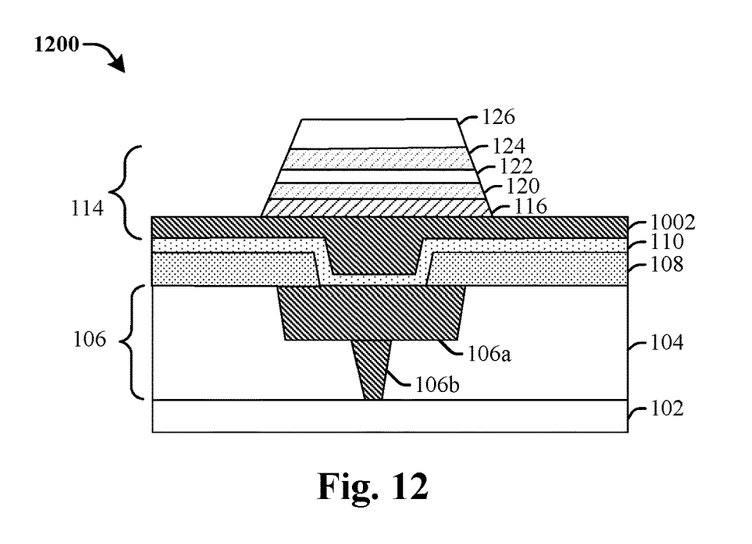

As shown in cross-sectional view 1200 of FIG. 12, the one or more top electrode layers 1104 are patterned to form a top electrode 118 of the memory device 114 and the resistive switching layer 1102 is patterned to form a memory element 116 (i.e., a resistive switching element). In some embodiments, sidewalls of the memory element 116 and the top electrode 118 can be tilted and linearly aligned (e.g., coplanar). In some embodiments, the patterning process can comprise a dry etching process that may have an etchant chemistry including tetrafluoromethane ($CF_4$), difluoromethane ($CH_2F_2$), chlorine ($Cl_2$), boron trichloride ($BCl_3$), and/or other chemicals.

Figure 13:
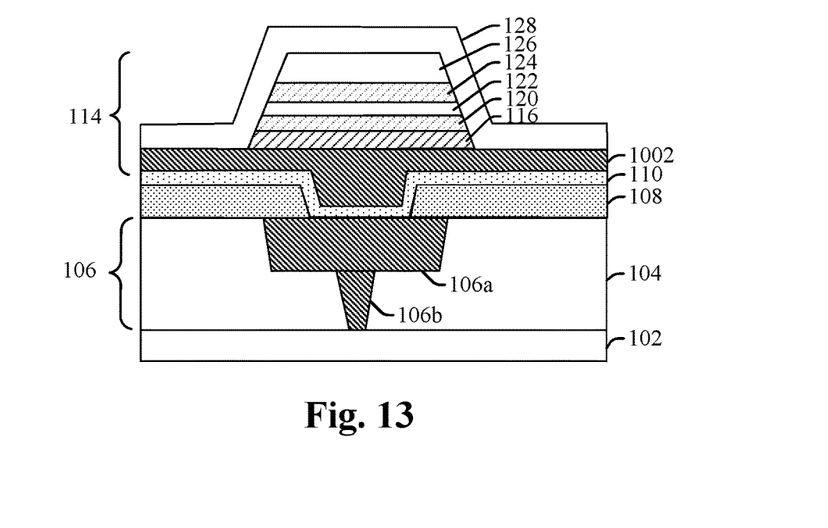

As shown in cross-sectional view 1300 of FIG. 13, a dielectric spacer layer 128 is formed along an upper surface of the memory device 114 including the planarized bottom electrode layer 1002. The dielectric spacer layer 128 may be comprised of silicon nitride, tetraethyl orthosilicate (TEOS), silicon-rich oxide (SRO), or a similar composite dielectric film. In some embodiments, the dielectric spacer layer 128 may be formed by a vapor deposition technique (e.g., physical vapor deposition, chemical vapor deposition, etc.).

Figure 14:
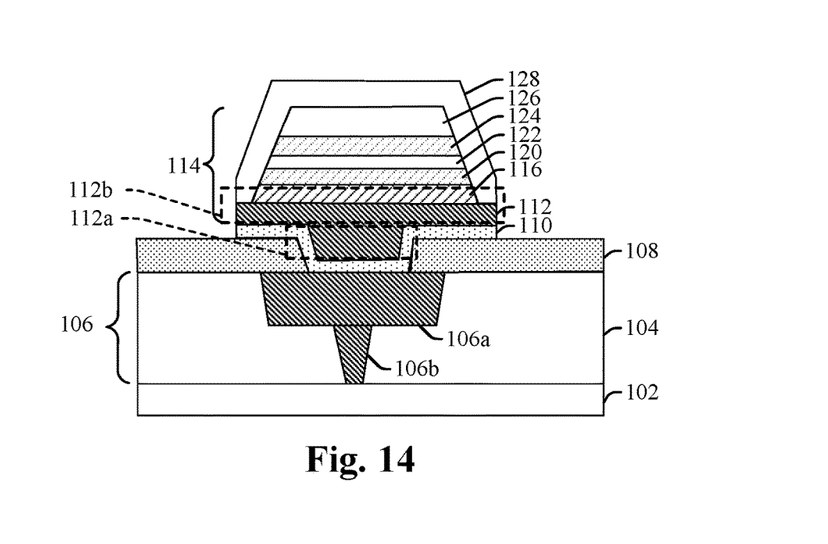

As shown in cross-sectional view 1400 of FIG. 14, the dielectric spacer layer 128 is patterned and removed from the memory device 114. In some embodiments, the patterning includes removing areas of the passivation layer 110 and the planarized bottom electrode layer 1002 not underlying the memory device 114 to form a bottom electrode structure 112. Accordingly, sidewalls of the passivation layer 110 and the bottom electrode structure 112 may be coplanar with the sidewalls of the dielectric spacer layer 128.

While the cross-sectional views corresponding to FIGS. 5-14 correspond to a memory region, the processes illustrated may also affect a logic region of an IC. By forming the BEVA region 112a and bottom electrode region 112b from the bottom electrode layer 902, additional BEVA planarization and/or patterning processes are not needed, and thus do not affect the logic region.

Figure 15:
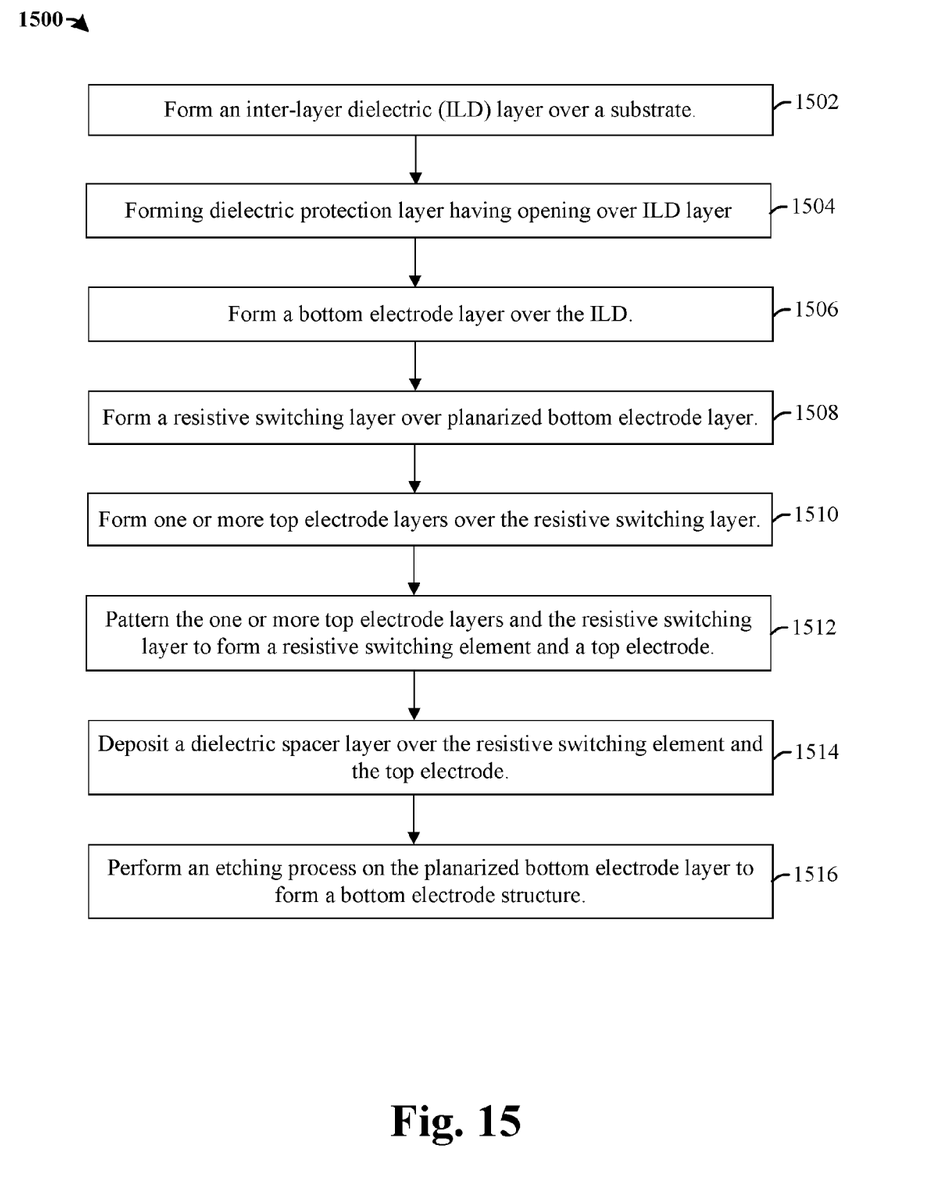
FIG. 15 illustrates a flow diagram of some embodiments of a method of manufacturing a memory device having a single bottom electrode structure comprising a bottom electrode region and bottom electrode via region.

FIG. 15 shows some embodiments of a flow diagram of a method 1500 of forming a flash memory device. Although method 1500 is described in relation to FIGS. 5-14, it will be appreciated that the method 1500 is not limited to such structures disclosed in FIGS. 5-14, but instead may stand alone independent of the structures disclosed in FIGS. 5-14. Similarly, it will be appreciated that the structures disclosed in FIGS. 5-14 are not limited to the method 1500, but instead may stand alone as structures independent of the method 1500. Also, while disclosed methods (e.g., method 1500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, an inter-layer dielectric (ILD) layer is formed over a substrate. In some embodiments, formation of the ILD layer is followed by a damascene process to form openings within the lower ILD layer and fill those openings with a metal material (e.g., copper, aluminum, etc).

At 1504, a dielectric protection layer is formed over the ILD layer. The dielectric protection layer is patterned to have an opening corresponding to formation of BEVA FIGS. 5-7 illustrate some embodiments of a cross-sectional views 500, 600, and 700 corresponding to act 1504.

At 1506, a bottom electrode layer is formed over the dielectric protection layer and the opening in the dielectric protection layer. FIG. 9 illustrates some embodiments of cross-sectional view 900 corresponding to act 1506.

At 1508, a chemical mechanical planarization (CMP) process is performed on the bottom electrode layer until the bottom electrode layer is substantially planar. A BEVA region and a bottom electrode region are both formed from the bottom electrode layer. FIG. 10 illustrates some embodiments of a cross-sectional view 1000 corresponding to act 1508.

At 1510, a resistive switching layer is formed over the planarized bottom electrode layer. FIG. 11 illustrates some embodiments of a cross-sectional view 1100 corresponding to act 1510.

At 1512, one or more top electrode layers are formed over the resistive switching layer. FIG. 11 illustrates some embodiments of a cross-sectional view 1100 corresponding to act 1512.

At 1514, the resistive switching layer and the one or more top electrode layers are patterned to form a resistive switching element and a top electrode. FIG. 12 illustrates some embodiments of a cross-sectional view 1200 corresponding to act 1514.

At 1516, a dielectric spacer layer is formed over the resistive switching element and the top electrode. The dielectric spacer layer has spacer layer sidewalls. FIG. 13 illustrates some embodiments of a cross-sectional view 1300 corresponding to act 1516.

At 1518, an etching process is performed on the planarized bottom electrode layer to form a bottom electrode structure having bottom electrode sidewalls that are coplanar with the spacer layer sidewalls. FIG. 14 illustrates some embodiments of a cross-sectional view 1400 corresponding to act 1518.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In some embodiments, the present disclosure relates to a method of manufacturing an integrated circuit (IC). The method comprises forming an inter-layer dielectric (ILD) layer over a substrate. An opening is formed within a dielectric protection layer over the ILD layer, and a bottom electrode layer is formed within the opening and over the dielectric protection layer. A chemical mechanical planarization (CMP) process is performed on the bottom electrode layer to form a bottom electrode structure having a planar upper surface and a projection that protrudes outward from a lower surface of the bottom electrode structure to within the opening. A memory element is formed over the bottom electrode structure and a top electrode is formed over the memory element.

In another embodiment, the present disclosure relates to a method of manufacturing an integrated circuit (IC). The method comprises forming a plurality of metal layers within an inter-layer dielectric (ILD) layer over a substrate, and forming a dielectric protection layer over the ILD layer. The dielectric protection layer has an opening overlying one of the plurality of metal layers. A conformal passivation layer is formed over the dielectric protection layer and the opening and a bottom electrode layer is deposited over the conformal passivation layer and within the opening. A chemical mechanical planarization (CMP) process is performed on the bottom electrode layer to form a planarized bottom electrode layer having a substantially planar upper surface. The planarized bottom electrode layer has a bottom electrode via (BEVA) region and a bottom electrode region. A resistive switching element is formed over the bottom electrode layer and a top electrode is formed over the resistive switching element. A dielectric spacer layer is formed over the resistive switching element and the top electrode. The dielectric spacer layer has spacer layer sidewalls. An etching process is performed on the planarized bottom electrode layer to form a bottom electrode structure having bottom electrode sidewalls co-planar with the spacer layer sidewalls.

In yet another embodiment, the present disclosure relates to an integrated circuit (IC). The IC includes a dielectric protection layer disposed over an ILD layer. The dielectric protection layer has an opening overlying a metal layer surrounded by the ILD layer. A passivation layer is disposed over the dielectric protection layer and within the opening. A bottom electrode structure is disposed over the passivation layer. The bottom electrode structure includes a bottom electrode via (BEVA) region and a bottom electrode region. A height of the bottom electrode region extends from an upper surface of the passivation layer to a top surface of the bottom electrode structure, and a lower surface of the bottom electrode structure has notches corresponding to protrusions in the passivation layer. A resistive switching element is arranged over the bottom electrode structure, and a top electrode is arranged over the resistive switching element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, comprising:
    forming an inter-layer dielectric (ILD) layer over a substrate, wherein a metal line is disposed within the ILD layer;
    forming a dielectric protection layer over the ILD layer;
    forming an opening in the dielectric protection layer that extends through the dielectric protection layer to an upper surface of the metal line, wherein the dielectric protection layer has a first protrusion on each side of the opening, wherein each first protrusion extends above an upper surface of the dielectric protection layer;
    forming a passivation layer over the dielectric protection layer and the opening, wherein the passivation layer contacts the metal line and has second protrusions, wherein each second protrusion is arranged over each first protrusion and extends above an upper surface of the passivation layer;
    forming a bottom electrode layer within the opening and over the passivation layer, wherein the bottom electrode layer has third protrusions respectively arranged over the first protrusions, wherein each third protrusion extends above an upper surface of the bottom electrode layer;
    performing a chemical mechanical planarization (CMP) process on the bottom electrode layer to remove each third protrusion from the bottom electrode layer and to form a bottom electrode structure having a planar upper surface and a projection that protrudes outward from a lower surface of the bottom electrode structure to within the opening, wherein the planar upper surface of the bottom electrode structure is disposed over an uppermost surface of the dielectric protection layer and an uppermost surface of the passivation layer;
    forming a memory element over the bottom electrode structure, wherein a bottom surface of the memory element contacts the planar upper surface of the bottom electrode structure and is also arranged directly over the upper surface of the metal line; and
    forming a top electrode over the memory element.

2. The method of claim 1, wherein the memory element is a magnetic tunnel junction.

3. The method of claim 2, wherein the magnetic tunnel junction comprises:
    a bottom ferromagnetic layer disposed over the bottom electrode structure;
    a tunnel barrier layer disposed over the bottom ferromagnetic layer; and
    a top ferromagnetic layer disposed over the tunnel barrier layer.

4. The method of claim 1, further comprising:
    depositing a dielectric spacer layer over the memory element and the top electrode, wherein the dielectric spacer layer has spacer layer sidewalls; and performing an etching process on the bottom electrode structure and the dielectric spacer layer, such that the bottom electrode structure has sidewalls that are co-planar with the spacer layer sidewalls.

5. The method of claim 1, wherein the bottom electrode structure is comprised of titanium nitride (TiN), tantalum nitride (TaN), tantalum (Ta), and/or titanium (Ti).

6. The method of claim 1, wherein the top electrode comprises a layer of tantalum and a layer of titanium nitride on the layer of tantalum.

7. The method of claim 1, wherein a sidewall of the memory element is aligned with a sidewall of the top electrode.

8. A method for fabricating an integrated circuit (IC), comprising:
forming a plurality of metal layers within an inter-layer dielectric (ILD) layer over a substrate;
forming a dielectric protection layer over the ILD layer, wherein the dielectric protection layer has an opening that extends through the dielectric protection layer to an upper surface of a first one of the plurality of metal layers, wherein the dielectric protection layer has a first protrusion on each side of the opening, wherein each first protrusion extends above an upper surface of the dielectric protection layer;
forming a passivation layer over the dielectric protection layer and the opening;
depositing a bottom electrode layer over the passivation layer and within the opening;
performing a chemical mechanical planarization (CMP) process on the bottom electrode layer to form a planarized bottom electrode layer having a planar upper surface, wherein the planarized bottom electrode layer has a bottom electrode via (BEVA) region and a bottom electrode region, and wherein the planarized bottom electrode layer has a first thickness measured from the planar upper surface to one of the first protrusions and a second thickness greater than the first thickness, wherein the second thickness is measured from the planar upper surface to the upper surface of the dielectric protection layer;
forming a resistive switching layer over the planarized bottom electrode layer;
forming a conductive layer over the resistive switching layer;
performing a first etch that etches both the conductive layer and the resistive switching layer to form a top electrode over a resistive switching element, wherein the resistive switching element is arranged directly over the upper surface of the first one of the plurality of metal layers; and
forming a dielectric spacer layer over the resistive switching element and the top electrode, wherein the dielectric spacer layer has spacer layer sidewalls.

9. The method of claim 8, wherein a BEVA region height extends from a first upper surface of the passivation layer to a second upper surface of the passivation layer.

10. The method of claim 9, wherein a height of the bottom electrode region extends from the second upper surface of the passivation layer to a top surface of the planarized bottom electrode layer.

11. The method of claim 8, the passivation layer is a tantalum nitride (TaN) diffusion barrier layer.

12. The method of claim 8, wherein the resistive switching element is a magnetic tunnel junction.

13. The method of claim 8, wherein the passivation layer has second protrusions, wherein each second protrusion extend above an upper surface of the passivation layer and is arranged over each first protrusion.

14. A method for forming a memory device, comprising:
forming an inter-layer dielectric (ILD) layer over a substrate, wherein a metal line is disposed within the ILD layer;
forming a dielectric protection layer over the ILD layer;
forming an opening in the dielectric protection layer that extends through the dielectric protection layer to a top surface of the metal line, where the dielectric protection layer has a first protrusion on each side of the opening, wherein each first protrusion extends above an upper surface of the dielectric protection layer;
forming a bottom electrode layer within the opening and over the dielectric protection layer, wherein the bottom electrode layer has second protrusions, wherein each second protrusion is arranged over each first protrusion and extends above an upper surface of the bottom electrode layer;
performing a chemical mechanical planarization (CMP) process on the bottom electrode layer to remove each second protrusion, thereby forming a bottom electrode structure having a planar upper surface over an uppermost surface of the dielectric protection layer and a projection that protrudes outward from a lower surface of the bottom electrode structure to within the opening;
forming a memory element directly over the first protrusions, wherein the bottom electrode structure comprises a single layer of material that continuously extends from within the opening to a bottom surface of the memory element; and
forming a top electrode over the memory element.

15. The method of claim 14, further comprising:
forming a passivation layer over the dielectric protection layer and the opening, wherein the passivation layer contacts the metal line, and wherein the bottom electrode layer is formed over the passivation layer.

16. The method of claim 15, wherein:
the passivation layer has third protrusions, wherein each third protrusion is arranged over each first protrusion and extends above an upper surface of the passivation layer; and
the planar upper surface of the bottom electrode structure is disposed over an uppermost surface of the passivation layer.

17. The method of claim 16, wherein the top electrode comprises a layer of tantalum and a layer of titanium nitride on the layer of tantalum.

18. The method of claim 14, wherein the memory element is a magnetic tunnel junction.

19. The method of claim 18, wherein the magnetic tunnel junction comprises:
a bottom ferromagnetic layer disposed over the bottom electrode structure;
a tunnel barrier layer disposed over the bottom ferromagnetic layer; and
a top ferromagnetic layer disposed over the tunnel barrier layer.

20. The method of claim 14, further comprising:
forming a diffusion barrier layer between the ILD layer and the metal line, and wherein the diffusion barrier layer covers a bottom surface and sidewalls of the metal line.

* * * * *